(12) United States Patent
Baker-O'Neal et al.

(10) Patent No.: US 8,008,199 B2
(45) Date of Patent: Aug. 30, 2011

(54) MICROSTRUCTURE MODIFICATION IN COPPER INTERCONNECT STRUCTURE

(75) Inventors: Brett C. Baker-O'Neal, Sleepy Hollow, NY (US); Cyril Cabral, Jr., Mahopac, NY (US); Qiang Huang, Sleepy Hollow, NY (US); Kenneth P. Rodbell, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/869,113

(22) Filed: Aug. 26, 2010

(65) Prior Publication Data

US 2010/0323517 A1 Dec. 23, 2010

Related U.S. Application Data

(62) Division of application No. 12/031,103, filed on Feb. 14, 2008, now Pat. No. 7,843,063.

(51) Int. Cl.
*H01L 21/44* (2006.01)
*H01L 21/4763* (2006.01)

(52) U.S. Cl. ......... 438/687; 438/653; 438/627; 438/643

(58) Field of Classification Search .................. 438/687, 438/653, 627, 643, 622, 618, 620, 624, 625, 438/638, 639
See application file for complete search history.

(56) References Cited

U.S. PATENT DOCUMENTS

| | | | |
|---|---|---|---|
| 3,615,922 A | 10/1971 | Alyea | |
| 4,915,903 A | 4/1990 | Brupbacher et al. | |
| 6,043,153 A | 3/2000 | Nogami et al. | |
| 6,181,012 B1 | 1/2001 | Edelstein et al. | |
| 6,268,291 B1 | 7/2001 | Andricacos et al. | |
| 6,429,523 B1 | 8/2002 | Andricacos et al. | |
| 6,551,872 B1 * | 4/2003 | Cunningham | ................ 438/225 |
| 6,642,146 B1 | 11/2003 | Rozbicki et al. | |

(Continued)

FOREIGN PATENT DOCUMENTS

EP 1094515 A2 4/2001

(Continued)

OTHER PUBLICATIONS

Harper et al., "Crystallographic Texture Change During Abnormal Grain Growth in Cu-Co Thin Films", Appl. Phys. Lett. (2004) vol. 65(2).
Harper, J. M. E., et al., "Microstructure Control in Semiconductor Metallization", Journal of Vacuum Science and Technology B (Microelectronics and Nanometer Structures), AIP for American Vacuum Soc., (1997) pp., vol. 15, No. 4, pp. 763-779.

*Primary Examiner* — Chuong A. Luu
(74) *Attorney, Agent, or Firm* — Scully, Scott, Murphy & Presser, P.C.; Louise J. Percello, Esq.

(57) ABSTRACT

Cobalt is added to a copper seed layer, a copper plating layer, or a copper capping layer in order to modify the microstructure of copper lines and vias. The cobalt can be in the form of a copper-cobalt alloy or as a very thin cobalt layer. The grain boundaries configured in bamboo microstructure in the inventive metal interconnect structure shut down copper grain boundary diffusion. The composition of the metal interconnect structure after grain growth contains from about 1 ppm to about 10% of cobalt in atomic concentration. Grain boundaries extend from a top surface of a copper-cobalt alloy line to a bottom surface of the copper-cobalt alloy line, and are separated from any other grain boundary by a distance greater than a width of the copper-cobalt alloy line.

12 Claims, 13 Drawing Sheets

U.S. PATENT DOCUMENTS

| | | |
|---|---|---|
| 7,180,188 B2 | 2/2007 | Oh et al. |
| 7,235,884 B1 | 6/2007 | McElheny et al. |
| 2002/0076925 A1 | 6/2002 | Marieb et al. |
| 2005/0085031 A1* | 4/2005 | Lopatin et al. ............... 438/222 |
| 2006/0113685 A1 | 6/2006 | Ueki et al. |
| 2007/0235873 A1* | 10/2007 | Cheng ........................ 257/738 |

FOREIGN PATENT DOCUMENTS

| | | |
|---|---|---|
| EP | 1744358 A1 | 1/2007 |
| JP | 2001118848 A | 4/2001 |
| WO | WO0245142 A2 | 6/2002 |

* cited by examiner

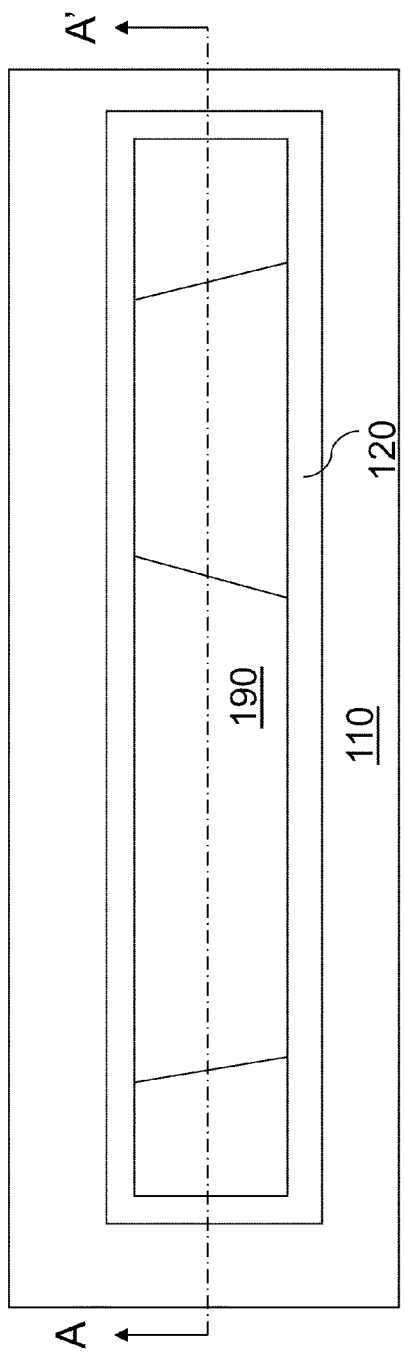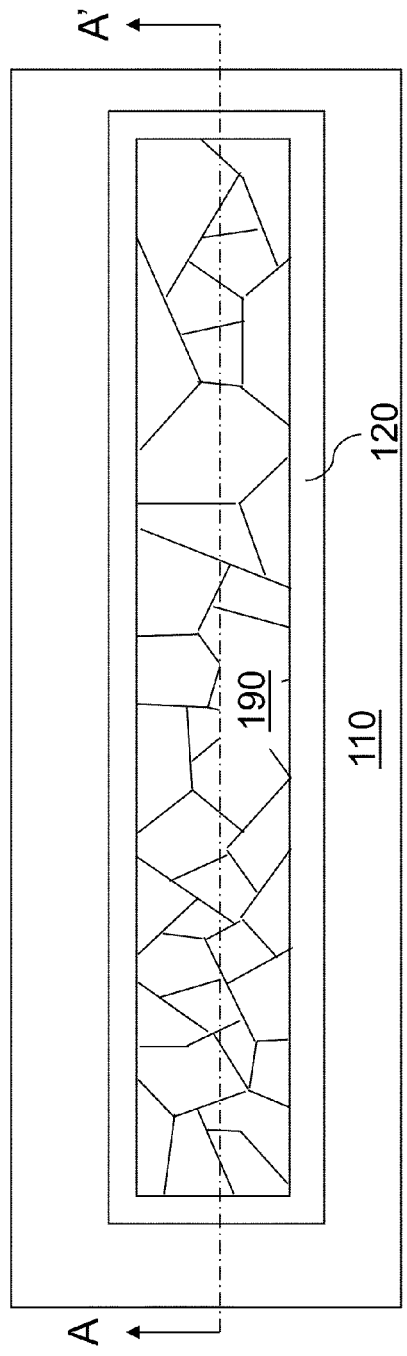
FIG. 3B (Prior Art)
FIG. 3C (Prior Art)

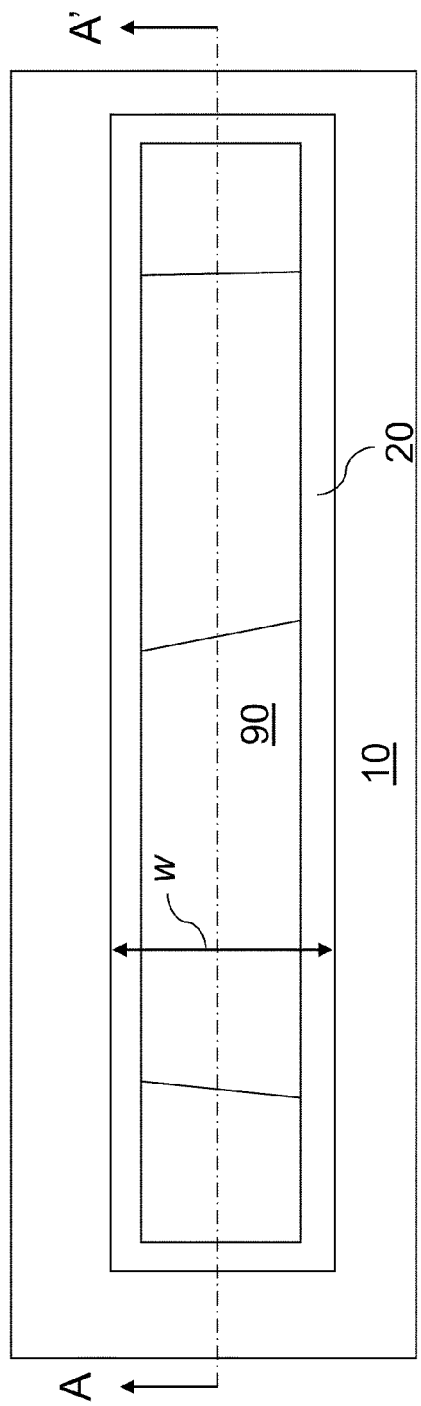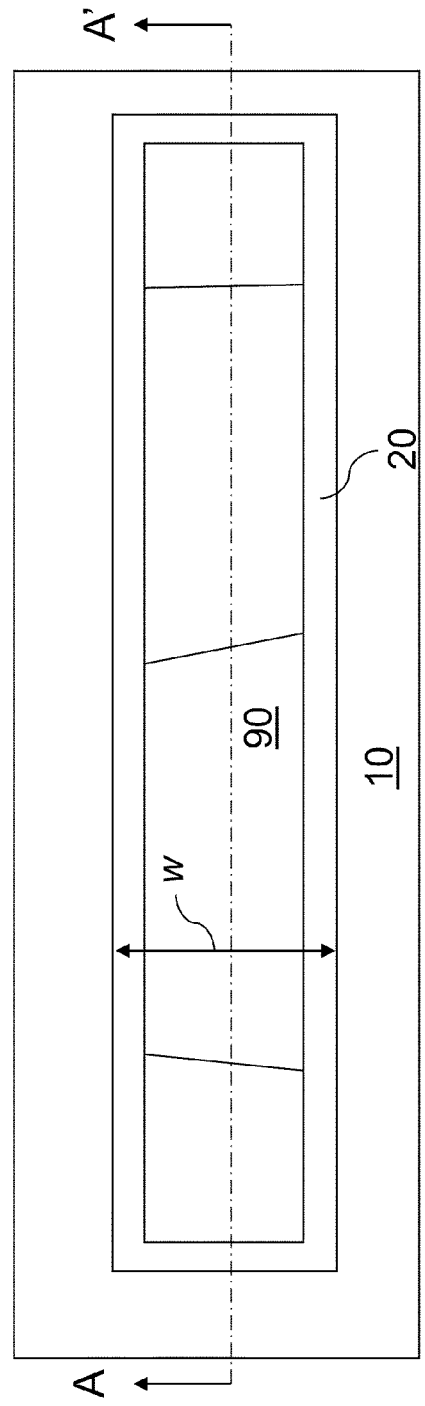

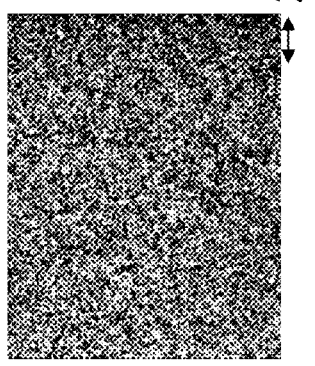
FIG. 10A Sample A; t = 0
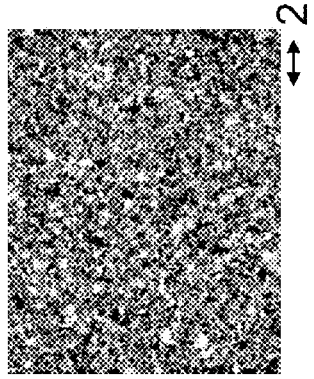
FIG. 11A Sample B; t = 0
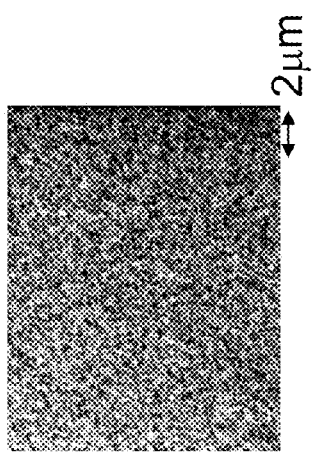
FIG. 10B Sample A; t = 1 day
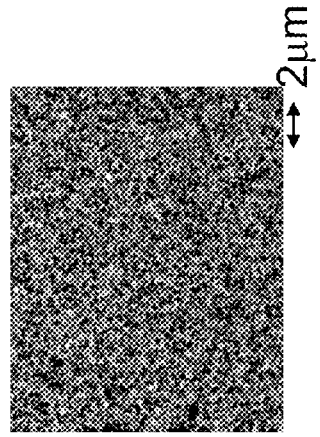
FIG. 11B Sample B; t = 1 day

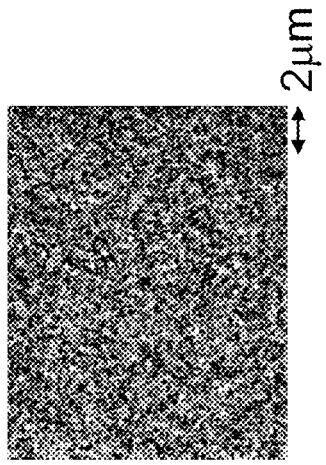
FIG. 12A *Sample C; t = 0*
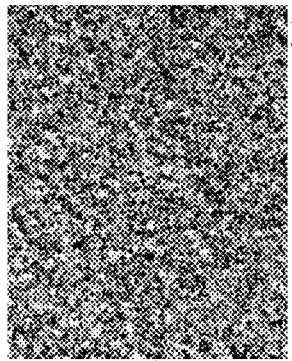
FIG. 12B *Sample C; t = 1 day*
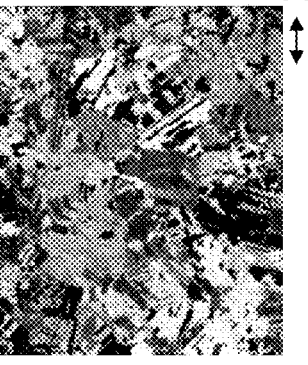
FIG. 13A *Sample D; t = 0*
FIG. 13B *Sample D; t = 1 hr*
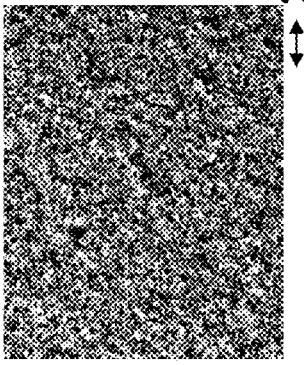
FIG. 13C *Sample D; t = 1 day*

MICROSTRUCTURE MODIFICATION IN COPPER INTERCONNECT STRUCTURE

CROSS REFERENCE TO RELATED APPLICATION

This application is a divisional of U.S. patent application Ser. No. 12/031,103, filed Feb. 14, 2008 U.S. Pat. No. 7,843,063 the entire content and disclosure of which is incorporated herein by reference.

FIELD OF THE INVENTION

The present invention relates to semiconductor structures, and particularly to metal interconnect structures having large grain sizes at a bottom of a metal interconnect line and methods of manufacturing the same.

BACKGROUND OF THE INVENTION

Current sub-90 nm copper interconnect technology suffers from a non-bamboo microstructure, i.e., a microstructure without bamboo-like features, in lines and vias. This leads to problems associated with copper diffusion such as electromigration and stress voiding.

Three different modes of copper diffusion are known. The first mode is copper diffusion along grain boundaries of a copper interconnect structure. The second mode is copper diffusion at a surface of a copper interconnect structure, i.e., at an interface at which the copper interconnect structure adjoins another material. The third mode is copper bulk diffusion through grains, i.e., across an interface at which two grain boundaries meet. Typically, the rate of diffusion is the highest for the first mode, and lowest for the third mode. Thus, it is advantageous to form a copper interconnect structure containing a metal line in which the metal line has a bamboo-like pattern in the grain microstructure, or a "bamboo microstructure." In the bamboo microstructure, the lateral width of a grain is the same as the width of the metal line or the metal via. The length of the grain is greater than the width of the metal line so that grain boundaries look like a stalk of a bamboo plant with notched segmentation.

It is advantageous to have a bamboo microstructure where grains span the width and height of a line or via. The phenomenon of electromigration occurs when a current flowing in the line, due to an externally applied field, leads to a net drift of Cu ions in the direction of the electron flow. This drift eventually will lead to line failure due to loss of copper at divergent sites such as grain boundaries and material interfaces. Since electrical current flows along the direction of a metal line and any electromigration is forced to occur "through," i.e., substantially perpendicular to the plane of, grain boundaries, the bamboo microstructure offers significantly more resistance to electromigration than non-bamboo microstructures. The bamboo microstructure essentially shuts down diffusion along grain boundaries, since bamboo grain boundaries are substantially at right angles to the current flow.

An alternative method of suppressing electromigration in a metal interconnect structure exists. It is well know that if the length of a metal line is less then the "Blech" length, copper ion motion will not occur, shutting down the electromigration process. Mechanical stress at lengths less than the "Blech" length opposes the drift of copper ions. A typical Blech length is on the order of 10 microns for present interconnect structures consisting of copper. While, in principle, designing all interconnect metal lines shorter than the "Blech" length would solve the problem, such a limitation puts a severe constraint on the design and layout of an interconnect structure, and practically renders such layouts impractical.

Thus, there exists a need for suppressing copper diffusion without resorting to use of a design rule stipulating that all metal interconnect lines be shorter than the "Blech" length. However, there are no currently known solutions for achieving a bamboo microstructure in sub-90 nm metal lines. Apparently, growth of the grain size is limited at the bottom of metal lines in fine featured metal interconnect structures employing copper.

Referring to FIG. 1, vertical cross-sectional view of an exemplary prior art interconnect structure comprises a dielectric layer 110, a barrier layer 120, a copper seed layer 130, and a plated copper layer 140. The dielectric layer 110 is typically formed on a semiconductor substrate (not shown) containing semiconductor devices (not shown). The dielectric layer 110 comprises a dielectric material. After formation of a via cavity and a line cavity within the dielectric layer 110 by lithographic patterning and etching, a barrier layer 120 is formed to prevent diffusion of contaminants into a metal via and a metal line to be subsequently formed, as well as to prevent the diffusion of metal into the dielectric layer 110, and to promote adhesion of the metal via and the metal line to the dielectric layer 110. The copper seed layer 130 is formed on the barrier layer 120, for example, by physical vapor deposition. The plated copper layer 140 is formed by plating on the copper seed layer 130. Typically, a superfill (bottom-up fill) process is employed to prevent formation of any seam in the metal via and the metal line.

The copper seed layer 130, as deposited, has a polycrystalline structure in which the average size of the grains is comparable with the thickness of the copper seed layer or less. Typically, the as-deposited copper seed layer 130 has an average grain size from about 2 nm to about 10 nm. The thickness of the copper seed layer 130 may be from about 5 nm to about 60 nm, and typically from about 10 nm to about 50 nm. The plated copper layer 140 has a microstructure in which the grain size is from about 5 nm to about 400 nm, and typically from about 10 nm to about 200 nm, although the grain size depends on the details of the plating process and may be less than or greater than the range indicated above.

Referring to FIG. 2, the exemplary prior art interconnect structure is subjected to a recrystallization process in which the grains in the copper seed layer 130 and the plated copper layer 140 grow. The recrystallization process typically employs an anneal at an elevated temperature. While the typical microstructure of a thin copper film, which has been annealed, has grain sizes 2-3 times the film thickness with a mixture of grain orientations, a bottom portion of a post-grain-growth copper layer 180 in a metal interconnect structure having fine features, e.g., features having a width less than 90 nm, contains small grains having a lesser dimension than the width of the metal interconnect structure. Typically, the dimensions of such small grains are about 2 to 4 times smaller than the width of the metal interconnect structure, i.e., the width of the metal line or the diameter of the via.

Referring to FIGS. 3A-3C, the post-grain-growth copper layer 180 is planarized to form a copper interconnect structure 190 so that a top surface of the copper interconnect structure 190 is substantially coplanar with a top surface of the dielectric layer 110. While the grain size near the top surface of the copper interconnect structure 190 may be about 2 to 3 times the width of the copper interconnect structure 190, the grain size near the bottom surface of the copper interconnect structure 190 is less than the width of the copper interconnect structure 190. Thus, despite an appearance of a bamboo microstructure as observed at a top surface of the copper interconnect structure 190, the copper interconnect structure 190 does not have a bamboo microstructure since the bottom portion of the copper interconnect structure 190 does not have large enough grains, and a bamboo-style segmentation between grain boundaries is not present in the exemplary prior art interconnect structure.

In view of the above, there exists a need for metal interconnect structure having fine features sizes such as sub-90 nm metal lines, i.e., metal lines having a width less than 90 nm, and containing a bamboo microstructure so that copper diffusion and associated problems may be avoided, and methods of forming such a metal interconnect structure.

SUMMARY OF THE INVENTION

The present invention incorporates cobalt into a copper interconnect structure in order to modify the microstructure to achieve bamboo-style grain boundaries in sub-90 nm technologies. Preferably, bamboo grains are separated at distances less than the "Blech" length so that copper diffusion through grain boundaries is avoided. The cobalt can be incorporated into a copper seed layer to be formed under a metal line, as a capping layer to be formed over a metal line, or during a plating process. Annealing the copper interconnect structure at temperatures above 250° C. induces preferential growth of (200) grains at a faster rate when Co is added to a plated Cu material. The added Co also triggers the growth of Cu grains down to the bottom surface of the metal line so that a true bamboo microstructure reaching to the bottom surface is formed, and the Cu diffusion mechanism along grain boundaries oriented along the length of the metal line is eliminated.

Cobalt is added to the copper seed layer, the copper plating layer, or the copper capping layer in order to modify the microstructure of copper lines and vias. The cobalt can be in the form of a copper-cobalt alloy or as a very thin cobalt layer. The cobalt can promote normal (growth of all orientations simultaneously) or abnormal grain growth (growth of the (200) orientations) in the fine lines and vias leading to bamboo grains (spanning the line width and height). Tailored to occur at distance less than the "Blech" length, the grain boundaries configured in bamboo microstructure in the inventive metal interconnect structure shut down copper grain boundary diffusion. At least one bamboo grain (at right angles to the current flow) every "Blech" length acts as a blocking site for copper diffusion. The composition of the metal interconnect structure after grain growth contains from about 1 ppm to about 10% of cobalt in atomic concentration.

According to an aspect of the present invention, a method of forming a metal interconnect structure is provided, which comprises:

providing a dielectric material layer containing a recessed line pattern;

forming a metallic barrier layer directly on the dielectric material layer at sidewalls of the recessed line pattern;

forming a copper-containing seed layer directly on the metallic barrier layer; and electroplating a copper-containing layer directly on the copper-containing seed layer, wherein at least one of the copper-containing seed layer and the copper-containing layer comprises a copper-cobalt alloy containing a cobalt concentration from about 1 ppm to about 10 atomic percent.

In one embodiment, the method further comprises annealing the copper-containing seed layer and the copper-containing layer at a temperature from about 20° C. to about 400° C. for a time period from about 1 second to about 1 week, wherein grain size increases during the annealing within the copper-containing layer.

In another embodiment, the method further comprises increasing grain size and decreasing resistance within the copper-containing seed layer and the copper-containing layer, wherein the copper-containing seed layer and the copper-containing layer form a bamboo microstructure within the recessed line pattern, and wherein each grain boundary within the bamboo microstructure extends to a bottom surface of the copper-containing layer.

The grain size may be increased within the copper-containing seed layer and the copper-containing layer such that grain boundaries are separated from one another by at least a width of a metal line at a bottom surface of the metal line.

In even another embodiment, the method further comprises planarizing the copper-containing layer, wherein a remaining portion of the copper-containing seed layer and the copper-containing layer constitutes a copper-cobalt alloy line, wherein an average grain size measured at a bottom of the copper-cobalt alloy line exceeds a width of the copper-cobalt alloy line.

In yet another embodiment, the copper-cobalt alloy line has a bamboo microstructure, wherein each grain boundary extends from the top surface of the copper-cobalt alloy line to a bottom surface of the copper-cobalt alloy line, and is separated from any other grain boundary by a distance greater than the width of the copper-cobalt alloy line.

In still another embodiment, the copper-containing seed layer comprises a copper-cobalt alloy containing a cobalt concentration from about 1 ppm to about 10 atomic percent, and wherein the copper-containing seed layer is formed by physical vapor deposition (PVD), chemical vapor deposition (CVD), atomic layer deposition (ALD), electrodeposition, or electroless deposition.

According to another aspect of the present invention, another method of forming a metal interconnect structure is provided, which comprises:

providing a dielectric material layer containing a recessed line pattern;

forming a metallic barrier layer directly on the dielectric material layer at sidewalls of the recessed line pattern;

forming a copper-containing seed layer directly on the metallic barrier layer;

electroplating a copper-containing layer directly on the copper-containing seed layer; and forming a copper-cobalt alloy cap layer containing a cobalt concentration from about 1 ppm % to about 50 atomic percent directly on the copper-containing layer.

In one embodiment, the method further comprises increasing grain size and decreasing resistance within the copper-containing seed layer and the copper-containing layer, wherein the copper-containing seed layer and the copper-containing layer form a bamboo microstructure within the recessed line pattern, and wherein each grain boundary within the bamboo microstructure extends to a bottom surface of the copper-containing layer.

In another embodiment, the method further comprises planarizing the copper-containing layer, wherein a remaining portion of the copper-containing seed layer and the copper-containing layer constitutes a copper-cobalt alloy line, wherein an average grain size measured at a bottom of the copper-cobalt alloy line exceeds a width of the copper-cobalt alloy line.

In yet another embodiment, the copper-cobalt alloy line has a bamboo microstructure, wherein each grain boundary extends from the top surface of the copper-cobalt alloy line to a bottom surface of the copper-cobalt alloy line, and is separated from any other grain boundary by a distance greater than the width of the copper-cobalt alloy line.

According to even another aspect of the present invention, a metal interconnect structure is provided, which comprises:

a dielectric material layer containing a recessed line pattern;

a metallic barrier layer abutting the dielectric material layer at sidewalls of the recessed line pattern and overlying an entirety of the dielectric material layer;

a copper-containing seed layer abutting the metallic barrier layer and overlying an entirety of the dielectric material layer; and a copper-containing layer comprising electroplated copper and abutting the copper-containing seed layer, wherein at least one of the copper-containing seed layer and the copper-containing layer comprises a copper-cobalt alloy containing a cobalt concentration from about 1 ppm to about 10 atomic percent.

In one embodiment, the copper-containing layer comprises O, N, C, Cl, and S, a sum of concentrations of which is from about 1 ppm to about 200 ppm.

In another embodiment, the copper-cobalt alloy contains a cobalt concentration from about 10 ppm to about 2 atomic percent.

In even another embodiment, the copper-containing seed layer comprises a copper-cobalt alloy containing a cobalt concentration from about 1 ppm to about 10 atomic percent and has a thickness from about 5 nm to about 60 nm.

In yet another embodiment, the copper-containing layer comprises a copper-cobalt alloy containing a cobalt concentration from about 1 ppm to about 10 atomic percent and has a thickness from about 50 nm to about 800 nm above a portion of the dielectric material layer located outside the recessed line pattern.

According to yet another aspect of the present invention, another metal interconnect structure is provided, which comprises:

a dielectric material layer containing a recessed line pattern;

a metallic barrier layer abutting the dielectric material layer at sidewalls of the recessed line pattern and overlying an entirety of the dielectric material layer;

a copper-containing seed layer abutting the metallic barrier layer and overlying an entirety of the dielectric material layer;

a copper-containing layer comprising electroplated copper and abutting the copper-containing seed layer; and a copper-cobalt alloy cap layer containing a cobalt concentration from about 1 ppm to about 50 atomic percent and abutting the copper-containing layer.

In one embodiment, the copper-containing layer comprises O, N, C, Cl, and S, a sum of concentrations of which is from about 1 ppm to about 200 ppm.

In another embodiment, the copper-cobalt alloy contains a cobalt concentration from about 10 ppm to about 10 atomic percent.

According to still another aspect of the present invention, yet another metal interconnect structure is provided, which comprises:

a dielectric material layer containing a recessed line pattern;

a metallic barrier layer abutting the dielectric material layer and embedded in the recessed line pattern; and a copper-cobalt alloy line abutting the copper alloy seed layer and embedded in the metal barrier layer and having an atomic concentration of cobalt from about 1 ppm to about 10 atomic percent, wherein an average grain size measured at a bottom of the copper-cobalt alloy line exceeds a width of the copper-cobalt alloy line.

In one embodiment, the copper-cobalt alloy line comprises O, N, C, Cl, and S, a sum of concentrations of which is from about 1 ppm to about 200 ppm.

In another embodiment, the atomic concentration of cobalt is from about 10 ppm to about 2 atomic percent.

In even another embodiment, a top surface of the copper-cobalt alloy line is substantially coplanar with a top surface of the dielectric material layer.

In still another embodiment, the copper-cobalt alloy line has a bamboo microstructure, wherein grain boundaries extends from the top surface of the copper-cobalt alloy line to a bottom surface of the copper-cobalt alloy line, and is separated from any other grain boundary by a distance greater than a width of the copper-cobalt alloy line.

In a further embodiment, the metal interconnect structure further comprises a copper-cobalt alloy via of integral construction with the copper-cobalt alloy line and free of any grain boundary parallel to the via, i.e., perpendicular to a substrate.

In a yet further embodiment, the metallic barrier layer is of unitary construction and abuts and encloses the copper-cobalt alloy via.

BRIEF DESCRIPTION OF THE DRAWINGS

FIGS. 1, 2, and 3A-3C show sequential views of an exemplary prior art interconnect structure. FIGS. 1, 2, and 3A are vertical cross-sectional views. FIG. 3B is a horizontal cross-sectional view of FIG. 3A along the plane B-B'. FIG. 3C is a horizontal cross-sectional views of FIG. 3A along the plane C-C'. The plane A-A' in FIGS. 3B and 3C is the plane of the vertical cross-sectional view of FIG. 3A.

FIGS. 4, 5, and 6A-6C show sequential views of a first exemplary interconnect structure according to a first embodiment of the present invention. FIGS. 4, 5, and 6A are vertical cross-sectional views. FIG. 6B is a horizontal cross-sectional view of FIG. 6A along the plane B-B'. FIG. 6C is a horizontal cross-sectional views of FIG. 6A along the plane C-C'. The plane A-A' in FIGS. 6B and 6C is the plane of the vertical cross-sectional view of FIG. 6A.

FIGS. 10A and 10B are focus ion beam (FIB) images of sample A immediately after plating and after 1 day, respectively.

FIGS. 11A and 11B are FIB images of sample B immediately after plating and after 1 day, respectively.

FIGS. 12A and 12B are FIB images of sample C immediately after plating and after 1 day, respectively.

FIGS. 13A-13C are FIB images of sample C immediately after plating, after 1 hour, and after 1 day, respectively.

DETAILED DESCRIPTION OF THE INVENTION

Figure 1:
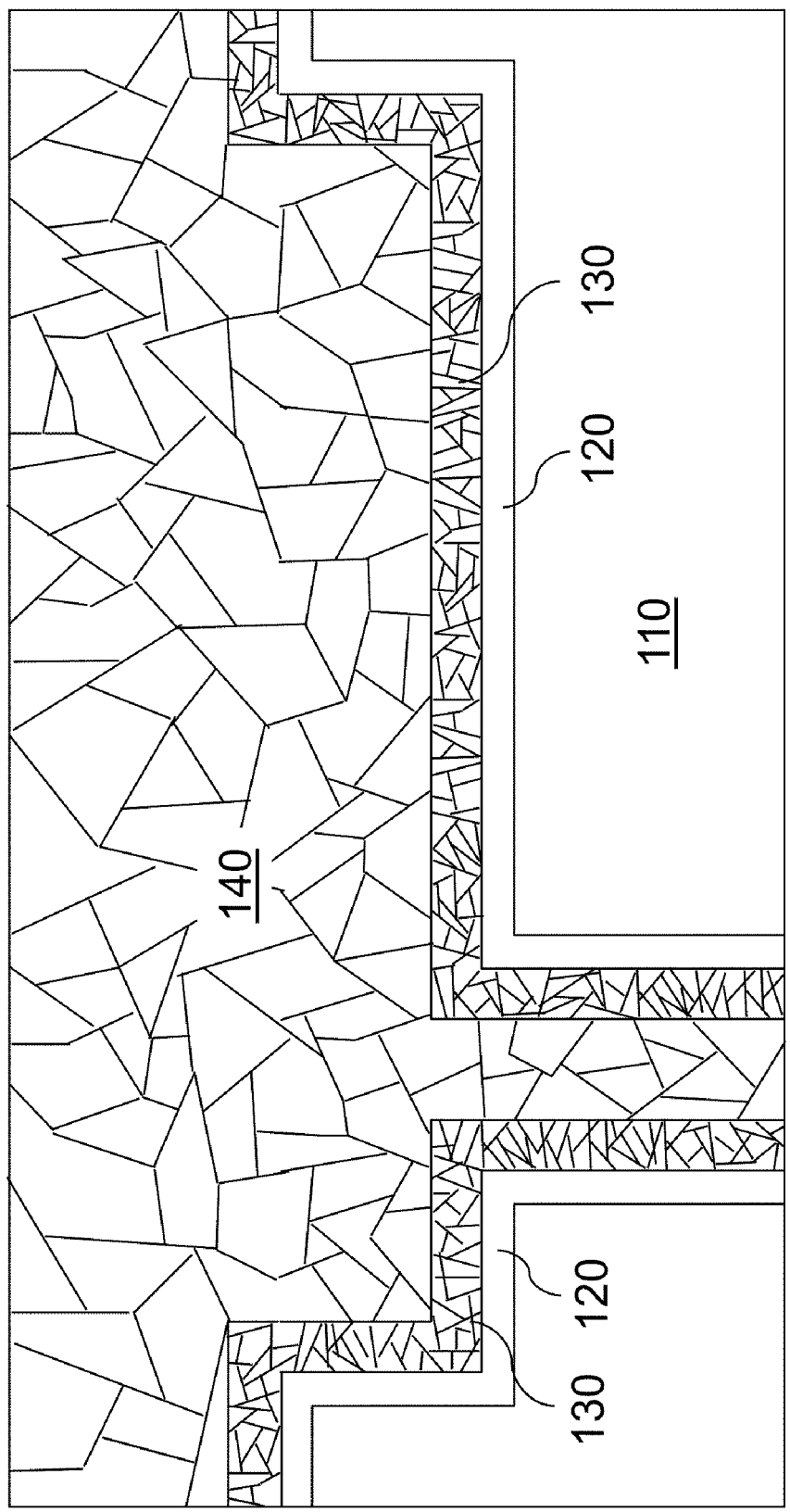
Figure 2:
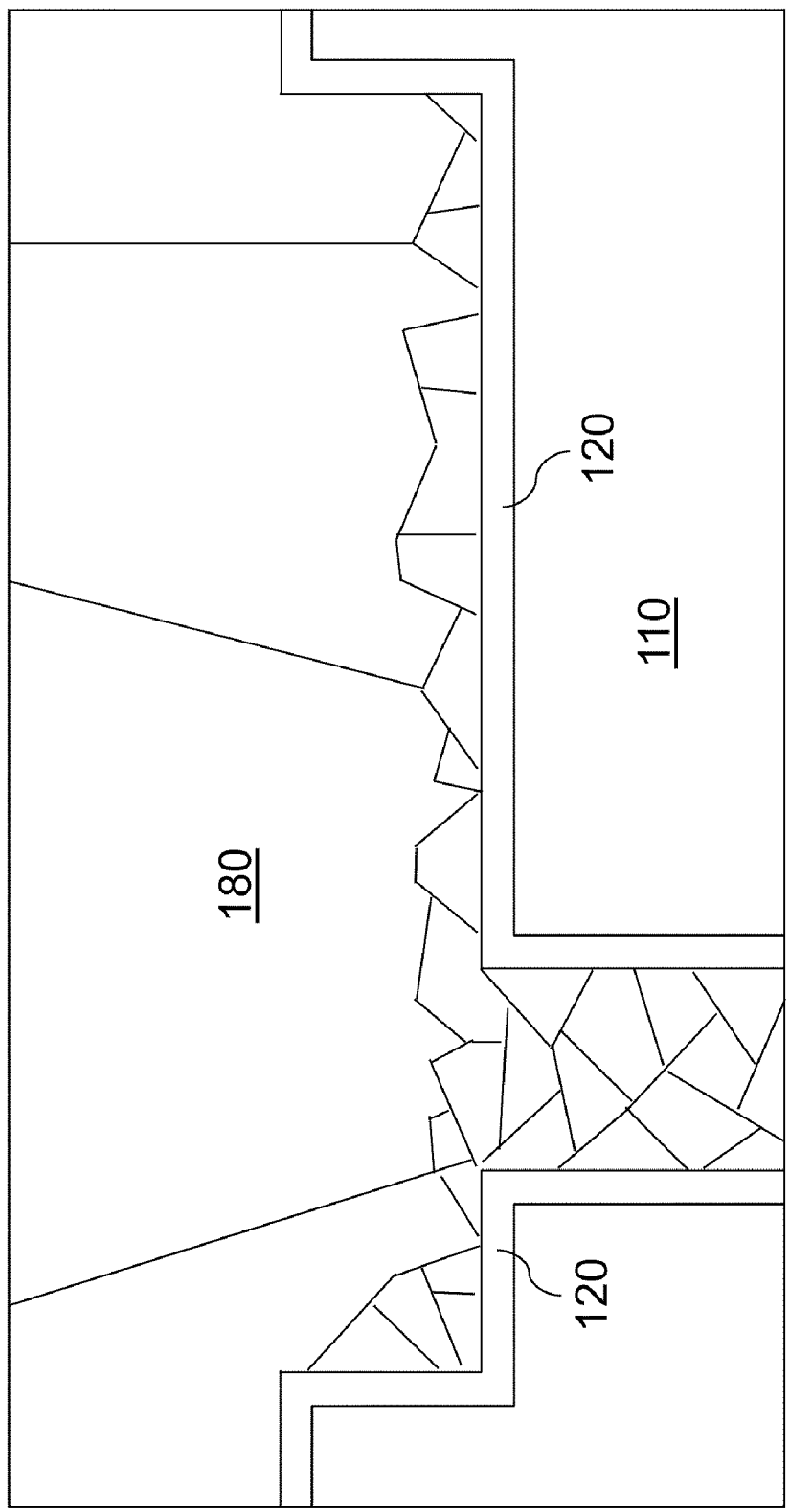
Figure 3A:
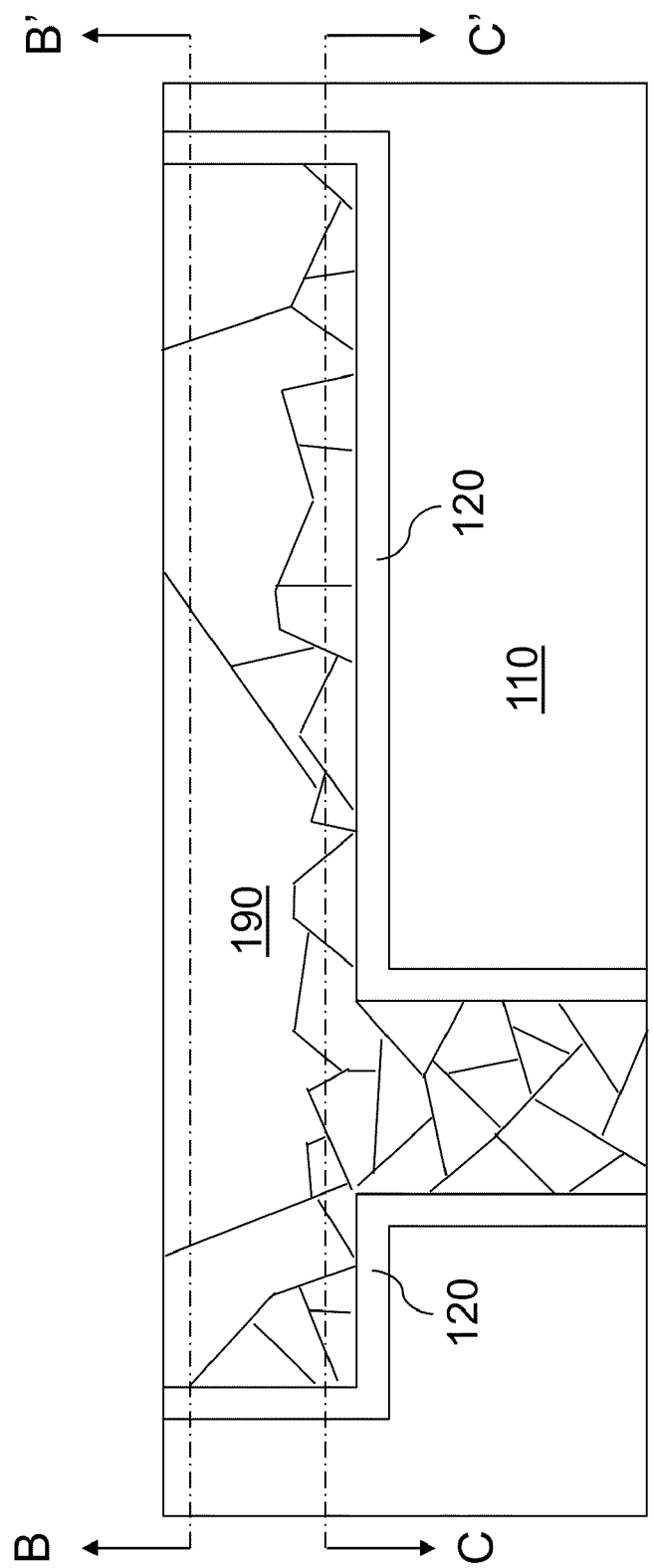

As stated above, the present invention relates to metal interconnect structures having large grain sizes at a bottom of a metal interconnect line and methods of manufacturing the same, which are now described in detail with accompanying figures. It is noted that like and corresponding elements are referred to by like reference numerals.

Figure 4:
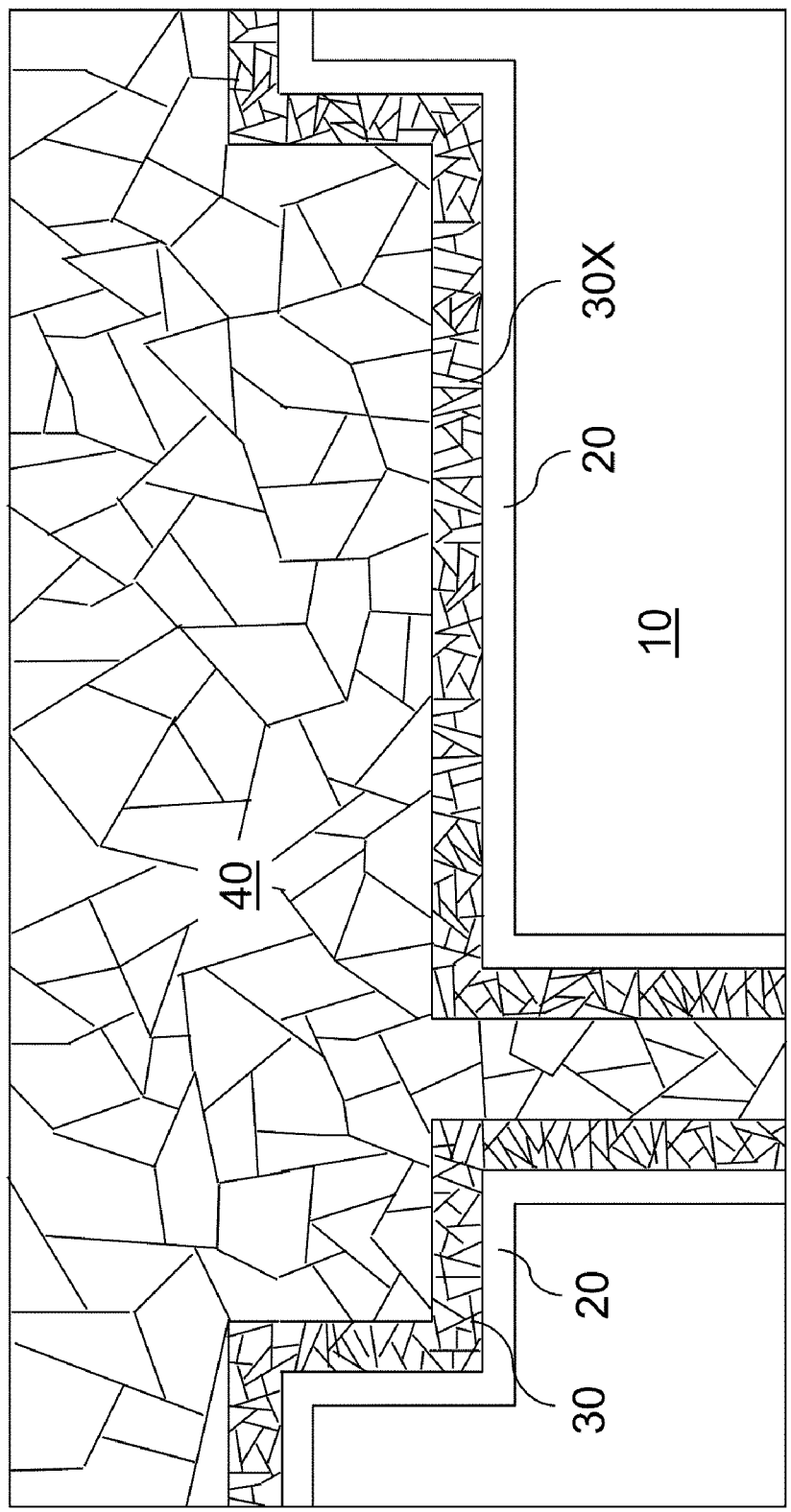

Referring to FIG. 4, a first exemplary metal interconnect structure according to a first embodiment of the present invention comprises a dielectric layer 10, a metallic barrier layer 20, a copper-cobalt alloy seed layer 30X, and a plated copper-containing layer 40. The dielectric layer 10 is typically formed on a semiconductor substrate (not shown) containing semiconductor devices (not shown). The dielectric layer 10 comprises a dielectric material such as silicon oxide, silicon nitride, organosilicate glass (OSG), SiCOH, a spin-on low-k dielectric material such as SiLK™, etc. The dielectric layer 10 may be porous, or non-porous. A via cavity and a line cavity is formed within the dielectric layer 10 by lithographic patterning and etching such that the via cavity overlaps with the line cavity in an integration scheme that is known in the art as a dual damascene integration scheme. While the present invention is described for a dual damascene integration scheme, variations of the present invention in a single damascene integration scheme is explicitly contemplated, in which the metal vias and metal lines are formed by two separated electroplating processes. In this case, the methods of the present invention is repeated twice, a first time, to form the metal vias containing a copper-cobalt alloy and having a single grain or large grains with boundaries running perpendicular to the via (parallel to the substrate), and a second time, to form metal lines containing a copper-cobalt alloy having the same bamboo structure as the bamboo structure to be described below for the dual damascene integration scheme.

A metallic barrier layer 20 is formed to prevent diffusion of contaminants from and/or into a metal via and a metal line to be subsequently formed, as well as to promote adhesion of the metal via and the metal line to the dielectric layer 10. The metallic barrier layer 20 may comprise Ta, TaN, W, WN, TiN, or a stack thereof such as Ta/TaN, Ta/TaN/Ta, TaN/Ta, etc. The metallic barrier layer 20 may be formed by chemical vapor deposition (CVD), physical vapor deposition (PVD), atomic layer deposition (ALD), etc. The thickness of the metallic barrier layer 20, as measured at a bottom surface of the line cavity, may be from about 1.5 nm to about 25 nm, and typically from about 3 nm to about 10 nm, although lesser and greater thicknesses are also contemplated herein.

The copper-cobalt alloy seed layer 30X is formed on the metallic barrier layer 20, for example, by physical vapor deposition (PVD), chemical vapor deposition (CVD), atomic layer deposition (ALD), electrodeposition, or electroless deposition. The copper-cobalt alloy seed layer 30X is a copper-containing seed layer which also comprises cobalt, i.e., comprises an alloy of copper and cobalt. Not necessarily but preferably, the copper-cobalt alloy seed layer 30X may consist of copper and cobalt. The concentration of cobalt in the copper-cobalt alloy seed layer 30X may be from about 1 ppm to 10 atomic percent, and preferably from about 10 ppm to about 2 atomic percent. Incorporation of cobalt into the copper-cobalt alloy seed layer 30X may be effected, for example, by replacing pure copper in a sputtering target of a PVD process with a target containing a copper-cobalt alloy.

The copper-cobalt alloy seed layer 30X, as deposited, has a polycrystalline structure in which the average size of the grains is comparable with the thickness of the copper-cobalt alloy seed layer 30X or less. Typically, the copper-cobalt alloy seed layer 30X has an average grain size from about 2 nm to about 10 nm. The thickness of the copper-cobalt alloy seed layer 30X, as measured above a bottom surface of the line cavity, may be from about 5 nm to about 60 nm, and typically from about 10 nm to about 50 nm, although lesser and greater thicknesses are also contemplated herein.

The plated copper-containing layer 40 is formed by plating a copper-containing material on the copper-cobalt alloy seed layer 30X. The plating process may employ electroplating or electroless plating. The plated copper-containing layer 40, due to the nature of the process employed for formation, i.e., due to the nature of the plating process, comprises O, N, C, Cl, and S. The sum of concentrations of O, N, C, Cl, and S is typically from about 1 ppm to about 200 ppm. Preferably, the plated copper-containing layer 40 is formed by electroplating. Typically, a superfill (bottom-up fill) process is employed to prevent formation of any seam within the via cavity or the line cavity so that the plated copper-containing layer 40 is free of any cavity therein.

The plated copper-containing layer 40 may, or may not, comprise cobalt. In one case, the plated copper-containing layer 40 may consist essentially of copper, so that any material other than copper in the plated copper-containing layer 40 is at a trace level. In another case, the plated copper-containing layer 40 may comprise a copper-cobalt alloy with a cobalt concentration from about 1 ppm to 10 atomic percent, and preferably from about 10 ppm to about 2 atomic percent. Incorporation of cobalt into the plated copper-containing layer 40 may be effected by replacing a plating bath containing a solution of pure copper with plating bath containing a solution of a copper-cobalt alloy, i.e., adding cobalt to the plating bath so that cobalt is incorporated into the film during plating.

The thickness of the plated copper-containing layer 40, as measured outside the area containing the via cavity and the line cavity prior to the filling thereof by the plated copper-containing layer 40, may be from about 50 nm to about 800 nm, and typically from about 100 nm to about 300 nm, although lesser and greater thicknesses are contemplated herein also. As deposited, the plated copper-containing layer 40 has a microstructure in which the grain size is from about 5 nm to about 400 nm, and typically from about 10 nm to about 200 nm, although the grain size depends on the details of the plating process and may be less than or greater than the range indicated above.

Figure 5:
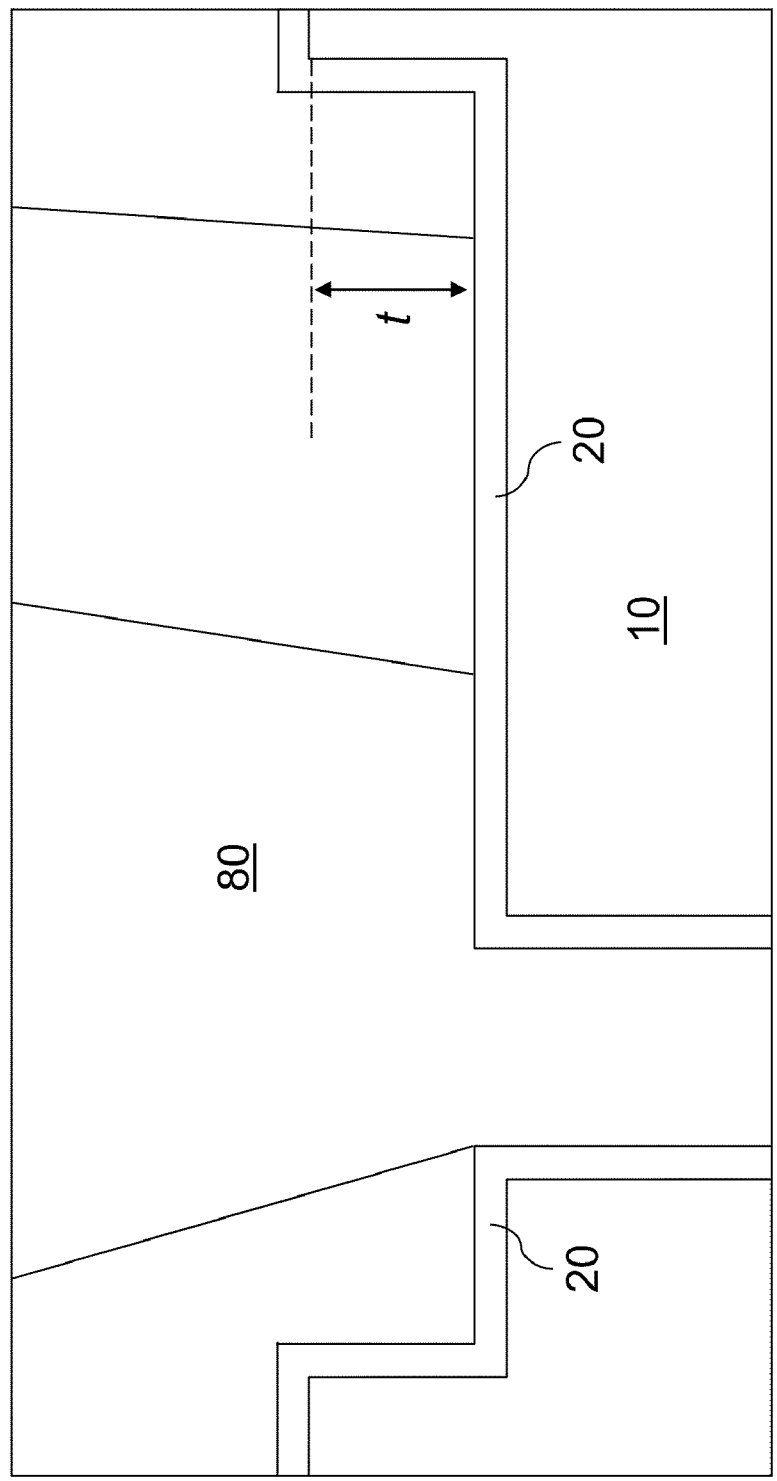

Referring to FIG. 5, the first exemplary metal interconnect structure is subjected to a recrystallization process in which the grains in the copper-cobalt alloy seed layer 30X and the plated copper-containing layer 40 grow. The recrystallization process typically employs an anneal at a temperature from about 20° C. to about 400° C. for a time period from about 1 second to about 1 week. The grain size increases during the annealing within the copper-cobalt alloy seed layer 30X and the plated copper-containing layer 40. While an anneal above 50° C. is preferred, some degree of recrystallization occurs at room temperature so that the present invention may be advantageously employed even without an anneal process, i.e., by leaving the first exemplary metal interconnect structure alone at room temperature for an extended time, and thereby increasing the size of the grains.

The cobalt added into copper-cobalt alloy seed layer 30X affects the microstructure of a copper-cobalt alloy layer 80, which is formed by the recrystallization of the copper-cobalt alloy seed layer 30X and the plated copper-containing layer 40, after the recrystallization process. Cobalt has low solubility in copper and forms no intermetallic compounds with copper. Cobalt thus precipitates in the grain boundaries during the recrystallization process. It has been observed during the research leading to the present invention that the cobalt also induces growth of large grains even at the interface with the metallic barrier layer 20 such that the size of the grains is substantially the same at the top of the copper-cobalt alloy layer 80 as at the bottom of the copper-cobalt alloy layer 80.

In general, a copper-cobalt alloy undergoes abnormal grain growth at temperatures above 250° C., in which various grain orientations grow at non-uniform growth rates. There is preferential grain growth of the (200) grains, which are termed grains of a "cubic" texture. This growth can be quite dramatic with final (200) grains over ten to fifteen times the film thickness. In this system, the grain growth mechanism favors the growth of (200) orientation grains over (111) orientation grains. In the end, large (200) grains are imbedded in finer (111) orientation grains. J. M. E. Harper et al., "Crystallographic texture change during abnormal grain growth in Cu—Co thin films," Appl. Phys. Lett. 65 (2) 177, (1994).

According to the present invention, cobalt in the copper-cobalt alloy seed layer 30X nucleates new grains in the plated copper-containing layer 40 so that the grains in the plated copper-containing layer 40 may grow to dimensions larger than the feature size of metal lines to be subsequently formed. Further, grain growth extends into the copper-cobalt alloy seed layer 30X so that the entirety of the copper-cobalt alloy layer 80 is affected by the grain growth. In addition, the plated copper-containing layer 40 may optionally supply additional cobalt to accelerate the abnormal grain growth during the recrystallization process.

The copper-cobalt alloy layer 80, which has been through the recrystallization process, has grain sizes 2-3 times the thickness t as measured over a line feature area of the copper-cobalt alloy layer 80 to the top surface of the dielectric layer 10. The bottom portion of the copper-cobalt alloy layer 80, including the portions corresponding to the via cavity and the line cavity prior to formation of the copper-cobalt alloy seed layer 30X, in the first exemplary metal interconnect structure does not contain small gains. This is because the grain size of the bottom portion of the copper-cobalt alloy layer 80 is substantially the same as the grain size of the top portion of the copper-cobalt alloy layer 80, and is thus from about 2-3 times the thickness t of the copper-cobalt alloy layer 80. The absence of small size grains at the bottom portion of the copper-cobalt alloy layer 80 prevents diffusion of copper atoms or cobalt atoms along a grain boundary. Grain boundaries that are present within a recessed line feature tend to run in the direction of the width of the recessed line feature. Thus, the grain boundaries in the copper-cobalt alloy layer 80 do not join one another, and the copper-cobalt alloy layer 80 has a bamboo microstructure in which grain boundaries within the bamboo microstructure extend to a bottom surface of copper-cobalt alloy layer 80 and separated from one another by at least one grain.

Figure 6A:
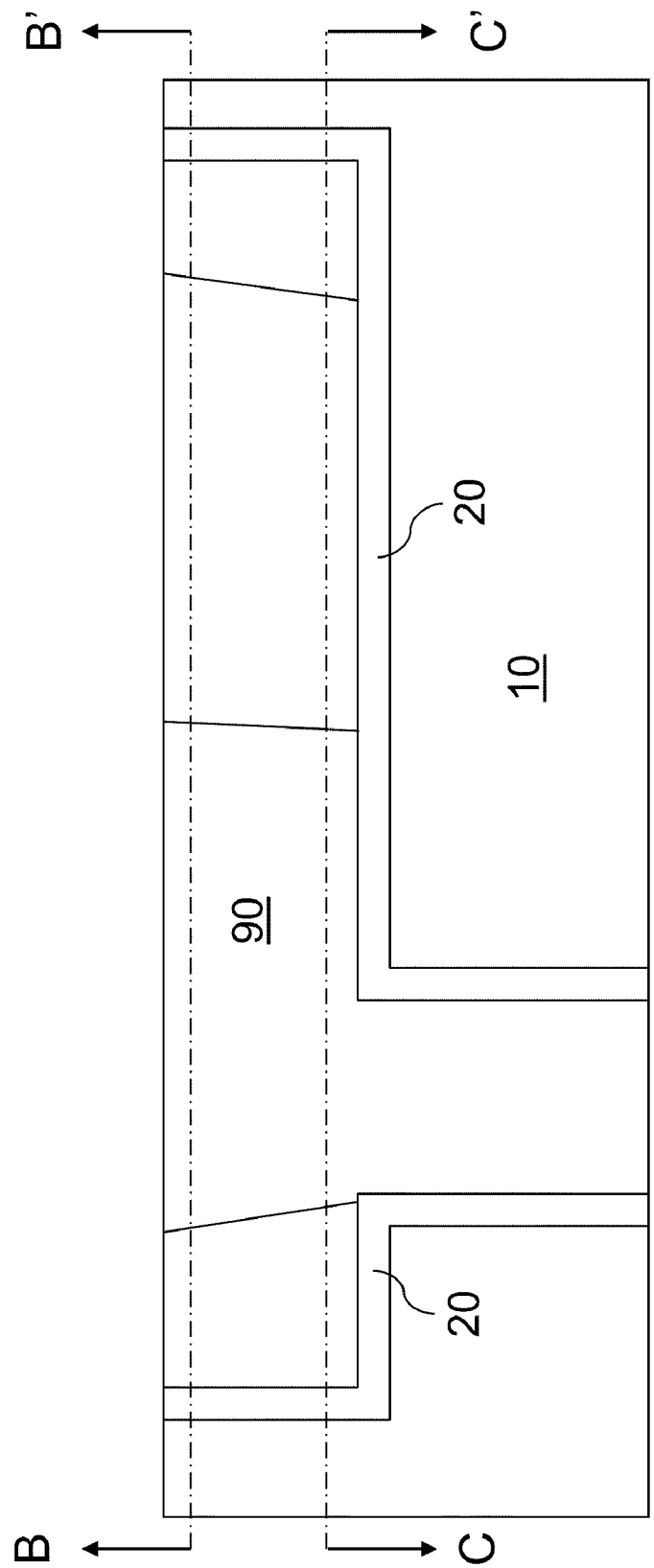

Referring to FIGS. 6A-6C, the copper-cobalt alloy layer 80 is planarized, for example, by chemical mechanical planarization, to form a copper-cobalt alloy line 90. A top surface of the copper-cobalt alloy line 90 is substantially coplanar with a top surface of the dielectric layer 10. The grain size near the top surface of the copper copper-cobalt alloy line 90, for example, as represented in the horizontal cross-sectional view of FIG. 6B, may be about, or greater than, 2 to 3 times the width of the copper-cobalt alloy line 90. The grain size of the copper copper-cobalt alloy line 90 at an interface with the metallic barrier layer 20, for example, as represented in the horizontal cross-sectional view of FIG. 6C, is substantially the same as the grain size of the copper-cobalt alloy line 90 near the top surface of the copper copper-cobalt alloy line 90, and consequently, may be about, or greater than, 2 to 3 times the width of the copper-cobalt alloy line 90. Thus, the copper-cobalt alloy line 90 has a bamboo microstructure throughout and is free of small grains having a size less than the width of the copper-cobalt alloy line 90. The bamboo-style segmentation between grain boundaries is present throughout the entirety of the copper-cobalt alloy line 90. The bamboo microstructure eliminates copper diffusion along grain boundaries since any remaining grain boundaries are substantially perpendicular to the direction of current flow.

Figure 7:
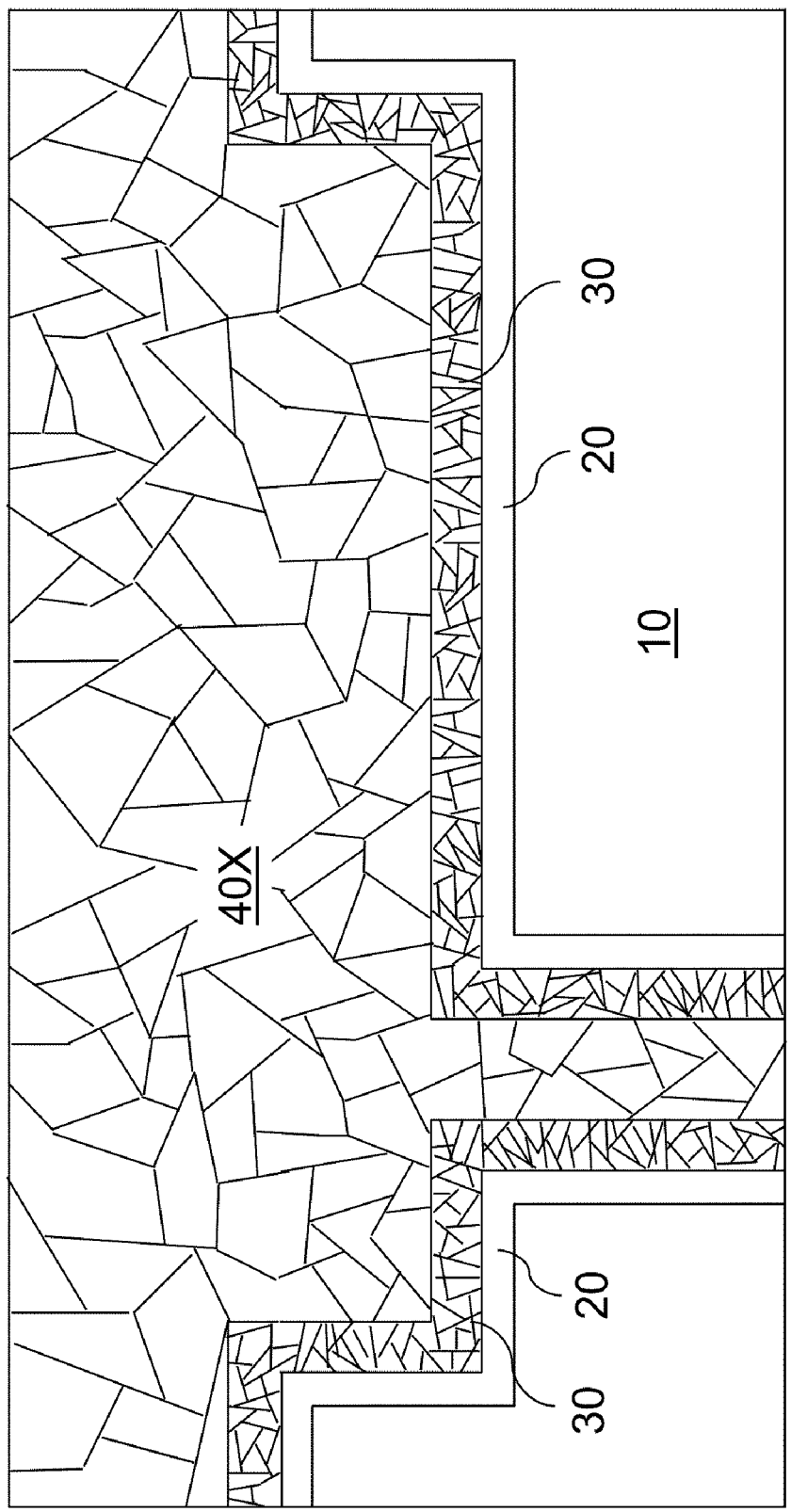
FIG. 7 is a vertical cross-sectional view of a second exemplary interconnect structure according to a second embodiment of the present invention.

Referring to FIG. 7, a second exemplary metal interconnect structure according to a second embodiment of the present invention comprises a dielectric layer 10, a metallic barrier layer 20, a copper-containing seed layer 30, and a plated copper-cobalt alloy layer 40X. The dielectric layer 10 is typically formed on a semiconductor substrate (not shown) containing semiconductor devices (not shown), and may comprise the same material as in the first embodiment. A via cavity and a line cavity is formed within the dielectric layer 10 by lithographic patterning and etching such that the via cavity overlaps with the line cavity in an integration scheme that is known in the art as a dual damascene integration scheme. A metallic barrier layer 20 is formed in the same manner as, and has the same composition and thickness as, in the first embodiment.

The copper-containing seed layer 30 is formed on the metallic barrier layer 20, for example, by physical vapor deposition (PVD), chemical vapor deposition (CVD), atomic layer deposition (ALD), electrodeposition, or electroless deposition. The copper-containing seed layer 30 may, or may not, comprise cobalt. In one case, the copper-containing seed layer 30 may consist essentially of copper, so that any material other than copper in the copper-containing seed layer 30 is at a trace level. In another case, the copper-containing seed layer 30 may comprise a copper-cobalt alloy with a cobalt concentration from about 1 ppm to 10 atomic percent, and preferably from about 10 ppm to about 2 atomic percent. Incorporation of cobalt into the copper-containing seed layer 30 may be effected, for example, by replacing pure copper in a sputtering target of a PVD process with a target containing a copper-cobalt alloy.

The copper-containing seed layer 30, as deposited, has a polycrystalline structure in which the average size of the grains is comparable with the thickness of the copper-containing seed layer 30 or less. Typically, the copper-containing seed layer 30 has an average grain size from about 2 nm to about 10 nm. The thickness of the copper-containing seed layer 30, as measured above a bottom surface of the line cavity, may be from about 5 nm to about 60 nm, and typically from about 10 nm to about 50 nm, although lesser and greater thicknesses are also contemplated herein.

The plated copper-cobalt alloy layer 40X is formed by plating a copper-cobalt alloy on the copper-containing seed layer 30. The plating process may employ electroplating or electroless plating. The plated copper-cobalt alloy layer 40X, due to the nature of the process employed for formation, i.e., due to the nature of the plating process, comprises O, N, C, Cl, and S. The sum of concentrations of O, N, C, Cl, and S is typically from about 1 ppm to about 200 ppm. Preferably, the plated copper-cobalt alloy layer 40 is formed by electroplating. Typically, a superfill (bottom-up fill) process is employed to prevent formation of any seam within the via cavity or the line cavity so that the plated copper-cobalt alloy layer 40X is free of any cavity therein.

The plated copper-cobalt alloy layer 40X is a copper-containing layer which also comprises cobalt, i.e., comprises an alloy of copper and cobalt. Not necessarily but preferably, metallic components of the plated copper-cobalt alloy layer 40X may consist of copper and cobalt. The concentration of cobalt in the plated copper-cobalt alloy layer 40X may be from about 1 ppm to 10 atomic percent, and preferably from about 10 ppm to about 2 atomic percent. Incorporation of cobalt into the plated copper-cobalt alloy layer 40X may be effected, for example, by replacing a plating bath containing a solution of pure copper with plating bath containing a solution of a copper-cobalt alloy, i.e., adding cobalt to the plating bath so that cobalt is incorporated into the film during plating.

The thickness of the plated copper-cobalt alloy layer 40X, as measured outside the area containing the via cavity and the line cavity prior to the filling thereof by the plated copper-containing layer 40, may be from about 50 nm to about 800 nm, and typically from about 100 nm to about 300 nm, although lesser and greater thicknesses are contemplated herein also. As deposited, the plated copper-cobalt alloy layer 40X has a microstructure in which the grain size is from about 5 nm to about 400 nm, and typically from about 10 nm to about 200 nm, although the grain size depends on the details of the plating process and may be less than or greater than the range indicated above.

The second exemplary metal interconnect structure is subjected to a recrystallization process in which the grains in the copper-containing seed layer 30 and the plated copper-cobalt alloy layer 40X grow. After the recrystallization process, the second exemplary metal interconnect structure is substantially the same as the first exemplary metal interconnect structure of FIG. 5 of the first embodiment. The copper-containing seed layer 30 and the plated copper-cobalt alloy layer 40X constitute a copper-cobalt alloy layer. The same kind of recrystallization process may be employed as in the first embodiment, and the grain size increases in the same manner as in the first embodiment. The cobalt added into plated copper-cobalt alloy layer 40X affects the microstructure of a copper-cobalt alloy layer 80, which is formed by the recrystallization of the copper-containing seed layer 30 and the plated copper-cobalt alloy layer 40X. Cobalt precipitates in the grain boundaries during the recrystallization process in the same manner as in the first embodiment. Cobalt induces growth of large grains even at the interface with the metallic barrier layer 20 such that the size of the grains is substantially the same at the top of a copper-cobalt alloy layer, which is substantially the same as the copper-cobalt alloy layer 80 in FIG. 5A, as at the bottom of the copper-cobalt alloy layer.

Cobalt present in the plated copper-cobalt alloy layer 40X triggers abnormal grain growth during the recrystallization process. The abnormal grain growth extends into the copper-containing seed layer 30 so that the entirety of the copper-cobalt alloy layer, which results from the copper-containing seed layer 30 and the plated copper-cobalt alloy layer 40X, is affected by the abnormal grain growth. If the copper-containing seed layer 30 further comprises cobalt, the additional cobalt in the copper-containing seed layer 30 may accelerate the abnormal grain growth during the recrystallization process.

The second exemplary metal interconnect structure is substantially the same as the first exemplary metal interconnect structure as shown in FIG. 5, and accordingly, the same physical, compositional, and structural characteristics. The copper-cobalt alloy layer is planarized in the same manner as in the first embodiment to form a copper-cobalt alloy line. The second exemplary metal interconnect structure at this point is substantially the same as the first exemplary metal interconnect structure in FIGS. 6A-6C. The second exemplary metal interconnect structure comprises the copper-cobalt alloy line, which has a bamboo microstructure throughout, and is free of small grains having a size less than the width of the copper-cobalt alloy line. The bamboo-style segmentation between grain boundaries is present throughout the entirety of the copper-cobalt alloy line as in the first exemplary metal interconnect structure. Thus, the bamboo microstructure eliminates copper diffusion along grain boundaries since any remaining grain boundaries are substantially perpendicular to the direction of current flow.

Figure 8:
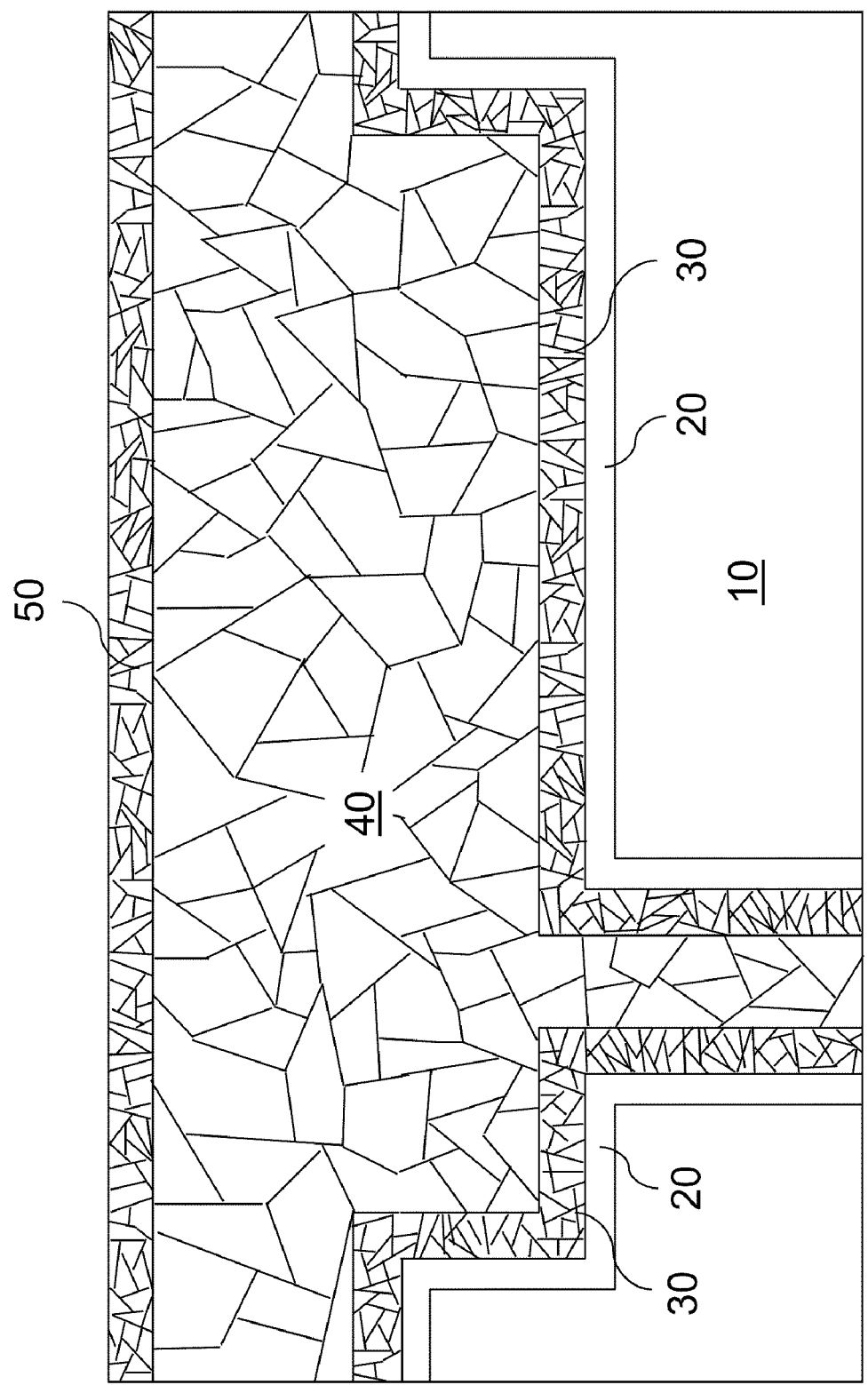
FIG. 8 is a vertical cross-sectional view of a third exemplary interconnect structure according to a third embodiment of the present invention.

Referring to FIG. 8, a third exemplary metal interconnect structure according to a third embodiment of the present invention comprises a dielectric layer 10, a metallic barrier layer 20, a copper-containing seed layer 30, plated copper-containing layer 40, and a copper-cobalt alloy cap layer 50. The dielectric layer 10 is typically formed on a semiconductor substrate (not shown) containing semiconductor devices (not shown), and may comprise the same material as in the first embodiment. A via cavity and a line cavity is formed within the dielectric layer 10 by lithographic patterning and etching such that the via cavity overlaps with the line cavity in an integration scheme that is known in the art as a dual damascene integration scheme. A metallic barrier layer 20 is formed in the same manner as, and has the same composition and thickness as, in the first embodiment.

The copper-containing seed layer 30 is formed on the metallic barrier layer 20, for example, by physical vapor deposition (PVD), chemical vapor deposition (CVD), atomic layer deposition (ALD), electrodeposition, or electroless deposition. The copper-containing seed layer 30 may, or may not, comprise cobalt. In one case, the copper-containing seed layer 30 may consist essentially of copper, so that any material other than copper in the copper-containing seed layer 30 is at a trace level. In another case, the copper-containing seed layer 30 may comprise a copper-cobalt alloy with a cobalt concentration from about 1 ppm to 10 atomic percent, and preferably from about 10 ppm to about 2 atomic percent. Incorporation of cobalt into the copper-containing seed layer 30 may be effected, for example, by replacing pure copper in a sputtering target of a PVD process with a target containing a copper-cobalt alloy. The copper-containing seed layer 30, as deposited, may have the same polycrystalline structure and thickness as in the first embodiment.

The plated copper-containing layer 40 is formed by plating a copper-containing material on the copper-containing seed layer 30. The plating process may employ electroplating or electroless plating. The plated copper-containing layer 40, due to the nature of the process employed for formation, i.e., due to the nature of the plating process, comprises O, N, C, Cl, and S. The sum of concentrations of O, N, C, Cl, and S is typically from about 1 ppm to about 200 ppm. Preferably, the plated copper-containing layer 40 is formed by electroplating. Typically, a superfill (bottom-up fill) process is employed to prevent formation of any seam within the via cavity or the line cavity so that the plated copper-containing layer 40 is free of any cavity therein.

The plated copper-containing layer 40 may, or may not, comprise cobalt. In one case, the plated copper-containing layer 40 may consist essentially of copper, so that any material other than copper in the plated copper-containing layer 40 is at a trace level. In another case, the plated copper-containing layer 40 may comprise a copper-cobalt alloy with a cobalt concentration from about 1 ppm to 10 atomic percent, and preferably from about 10 ppm to about 2 atomic percent. Incorporation of cobalt into the plated copper-containing layer 40 may be effected by replacing a plating bath containing a solution of pure copper with plating bath containing a solution of a copper-cobalt alloy, i.e., adding cobalt to the plating bath so that cobalt is incorporated into the film during plating. The microstructure and the thickness of the plated copper-containing layer 40 may be the same as in the first embodiment.

The copper-cobalt alloy cap layer 50 comprises an alloy of copper and cobalt, and may consist of an alloy of copper and cobalt. The an concentration of cobalt in the copper-cobalt alloy cap layer 50 may be from about 1 ppm to about 50 atomic percent, and preferably from about 10 ppm to about 40 atomic percent, and more preferably from about 100 ppm to about 30 atoic percent. The copper-cobalt alloy cap layer 50 may be formed, for example, by physical vapor deposition (PVD), chemical vapor deposition (CVD), atomic layer deposition (ALD), electrodeposition, or electroless deposition.

The thickness of the copper-cobalt alloy cap layer 50 may be from about 1 nm to about 50 nm, and typically from about 3 nm to about 30 nm, although lesser and greater thicknesses are contemplated herein also. As deposited, the copper-cobalt alloy cap layer 50 has a microstructure in which the grain size is from about 2 nm to about 10 nm, and typically from about 5 nm to about 10 nm, although the grain size depends on the details of the deposition process and may be less than or greater than the range indicated above.

The third exemplary metal interconnect structure is subjected to a recrystallization process in which the grains grow in the copper-cobalt alloy cap layer 50, the plated copper-containing layer 40, and the copper-containing seed layer 30. After the recrystallization process, the third exemplary metal interconnect structure is substantially the same as the first exemplary metal interconnect structure of FIG. 5 of the first embodiment. The copper-cobalt alloy cap layer 50, the plated copper-containing layer 40, and the copper-containing seed layer 30 collectively become a copper-cobalt alloy layer. The same kind of recrystallization process may be employed as in the first embodiment, and the grain size increases in the same manner as in the first embodiment. The cobalt added into the copper-cobalt alloy cap layer 50 affects the microstructure of a copper-cobalt alloy layer 80 after the recrystallization process. Cobalt precipitates in the grain boundaries during the recrystallization process in the same manner as in the first embodiment. Cobalt induces growth of large grains at the top interface with the copper-cobalt cap layer 50 such that the size of the grains is substantially the same at the top of the copper-cobalt cap alloy layer, which is substantially the same as the copper-cobalt alloy layer 80 in FIG. 5A, as at the bottom of the copper-cobalt alloy layer.

Cobalt present in the copper-cobalt alloy cap layer 50 triggers grain growth during the recrystallization process. The grain growth extends into the plated copper-containing layer 40 and the copper-containing seed layer 30 so that the entirety of the copper-cobalt alloy layer, which results from the copper-cobalt alloy cap layer 50, the plated copper-containing layer 40, and the copper-containing seed layer 30, is affected by the grain growth. If the plated copper-containing layer 40 further comprises cobalt, the additional cobalt in the plated copper-containing layer 40 may accelerate the abnormal grain growth during the recrystallization process. If the copper-containing seed layer 30 further comprises cobalt, the additional cobalt in the copper-containing seed layer 30 may also accelerate the grain growth during the recrystallization process.

The third exemplary metal interconnect structure is substantially the same as the first exemplary metal interconnect structure as shown in FIG. 5, and accordingly, the same physical, compositional, and structural characteristics. The copper-cobalt alloy layer is planarized in the same manner as in the first embodiment to form a copper-cobalt alloy line. The third exemplary metal interconnect structure at this point is substantially the same as the first exemplary metal interconnect structure in FIGS. 6A-6C. The third exemplary metal interconnect structure comprises the copper-cobalt alloy line, which has a bamboo microstructure throughout, and is free of small grains having a size less than the width of the copper-cobalt alloy line. The bamboo-style segmentation between grain boundaries is present throughout the entirety of the copper-cobalt alloy line as in the first exemplary metal interconnect structure. Thus, the bamboo microstructure eliminates copper diffusion along grain boundaries since any remaining grain boundaries are substantially perpendicular to the direction of current flow.

Figure 9:
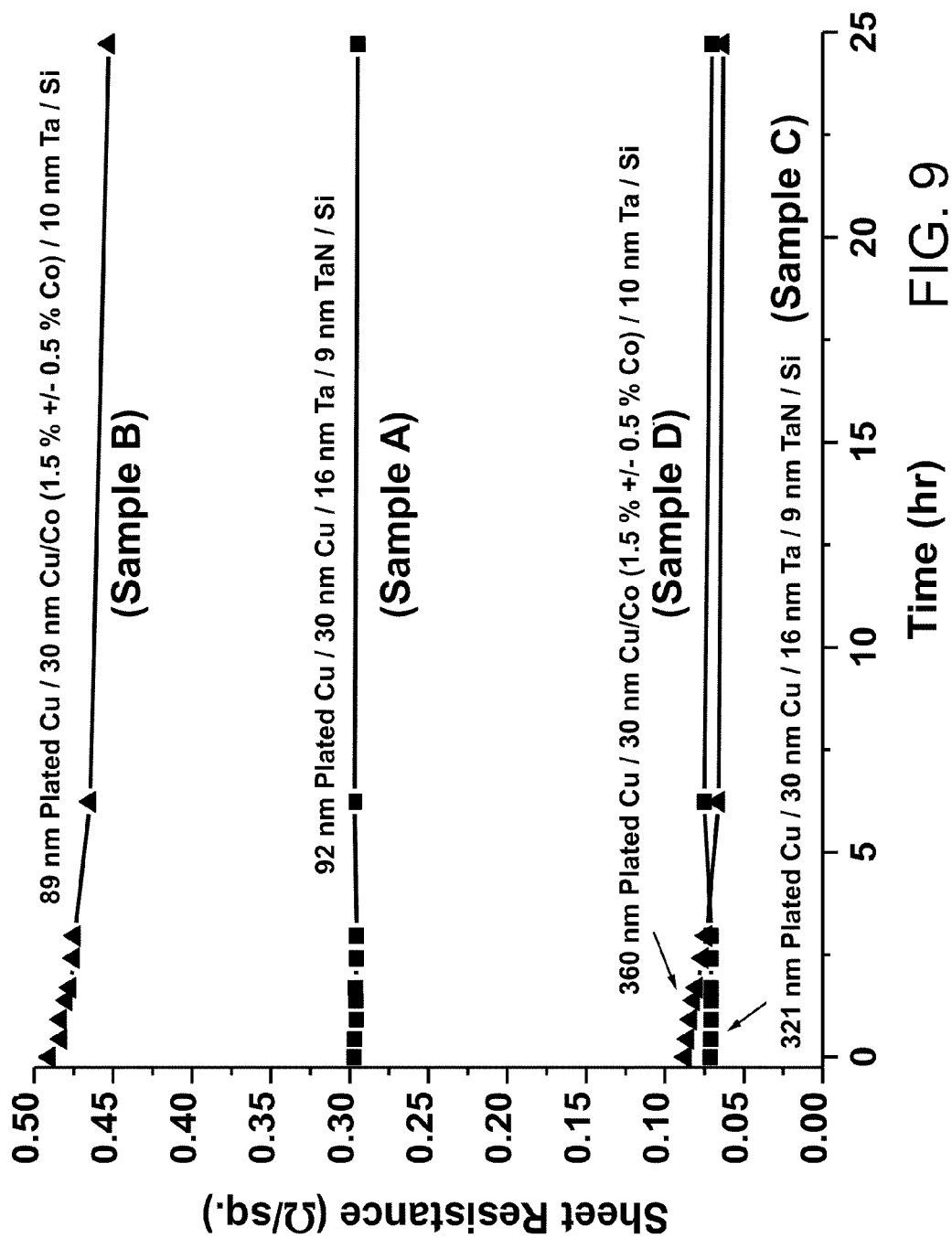
FIG. 9 is a graph showing a comparison of samples A-D for a time-dependent sheet resistance. Samples A and C are prior art structures and samples C and D are structures according to the present invention.

Referring to FIG. 9, a graph showing sheet resistance as a function of time up to 25 hours after plating for electroplated copper films that are subsequently maintained at room temperature is presented. The electroplated copper films have a thickness of about 90 nm or about 340 nm, and formed on either a pure copper seed layer or a copper-cobalt alloy seed layer at about 1.5% atomic concentration of cobalt. Specifically, sample A was prepared by deposition of a barrier layer comprising a stack of 9 nm thick TaN and 16 nm thick Ta on a silicon substrate, followed by deposition of a 30 nm thick Cu seed layer. A 92 nm thick Cu layer was plated on the 30 nm thick Cu seed layer. Sample B was prepared by deposition of a barrier layer comprising 10 nm thick Ta on a silicon substrate, followed by deposition of a 30 nm thick copper-cobalt alloy seed layer containing cobalt at an atomic concentration of about 1.5%+/−0.5%. An 89 nm thick Cu layer was plated on the 30 nm thick copper-cobalt alloy seed layer. Sample C (represented by square data points) was prepared by deposition of a barrier layer comprising a stack of 9 nm thick TaN and 16 nm thick Ta on a silicon substrate, followed by deposition of a 30 nm thick Cu seed layer. A 321 nm thick Cu layer was plated on the 30 nm thick Cu seed layer. Sample D (represented by triangular data points) was prepared by deposition of a barrier layer comprising 10 nm thick Ta on a silicon substrate, followed by deposition of a 30 nm thick copper-cobalt alloy seed layer containing cobalt at an atomic concentration of about 1.5%+/−0.5%. A 360 nm thick Cu layer was plated on the 30 nm thick copper-cobalt alloy seed layer.

It is well know that thick electroplated copper films, i.e., having a thickness greater than 500 nm, undergo room temperature recrystallization, i.e., grain growth, which is manifested as a decrease in sheet resistance over time (typically a period of days). Thin electroplated copper films, i.e., having a thickness less than 500 nm, typically show little or no sheet resistance decrease at room temperature. Samples A and C, which contain plated copper films (92 nm or 321 nm thick, respectively) on a 30 nm thick pure copper seed layer show little change in sheet resistance over a time period of 100 hours. (Note: The data in FIG. 9 is plotted up to 25 hours) The total change in the sheet resistance has been measured to be less than 4% in samples A and C over the time period of 100 hours. In comparison, samples B and D, which comprises substantially the same plated copper films s (89 nm or 360 nm thick, respectively) on a copper-cobalt alloy seed layer, show sheet resistance decreases of 14% and 26%, respectively, over the same time period of 100 hours. This indicates that in these very thin films having a thickness less than 500 nm, with the use of a copper-cobalt alloy seed layer, grain growth can occur even at room temperature. Elevated temperature accelerates the rate of grain growth and the final size of the grains.

Top-down focused ion beam (FIB) maps showing the Cu microstructure for sample A, sample B, sample C, and sample D are shown in FIGS. 10A and 10B, FIGS. 11A and 11B, FIGS. 12A and 12A, and FIGS. 13A-13C, respectively. FIG. 10A is a top-down FIB map for the sample A immediately after the copper plating process that formed the 92 nm thick copper film, and FIG. 10B is a top-down FIB map for the sample A 24 hours after the copper plating process. FIG. 11A is a top-down FIB map for the sample B immediately after the copper plating process that formed the 89 nm thick copper film, and FIG. 11B is a top-down FIB map for the sample B 24 hours after the copper plating process. FIG. 12A is a top-down FIB map for the sample C immediately after the copper plating process that formed the 321 nm thick copper film, and FIG. 12B is a top-down FIB map for the sample C 24 hours after the copper plating process. FIG. 13A is a top-down FIB map for the sample D immediately after the copper plating process that formed the 360 nm thick copper film, FIG. 13B is a top-down FIB map for the sample D 1 hour after the copper plating process, and FIG. 13C is a top-down FIB map for the sample D 24 hours after the copper plating process.

For the sample A and the sample C, in which the plated copper layer was formed on a pure copper seed layer, the microstructure of the plated copper film after 1 day at room temperature looks identical to the microstructure of the plated copper film immediately after plating. For the samples B and the sample D, in contrast, in which the plated copper layer was formed on a copper-cobalt alloy seed layer, the microstructure of the plated copper film undergoes a grain growth process, i.e., a recrystallization process, over the time period of 24 hours. The final grain sizes have been measured to be between 2 to 3 times the film thickness of the plated copper layer.

The recrystallization process at room temperature demonstrates one method of a recrystallization process, and the present invention may be implemented by introducing cobalt in any one or more of a seed layer, plated layer, and a cap layer as described above. Further, anneal temperature may be optimized to increase the grain size and/or to accelerate the recrystallization process to achieve a bamboo microstructure in metal lines and underlying vias.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a metal interconnect structure comprising:
   providing a dielectric material layer containing a recessed line pattern;
   forming a metallic barrier layer directly on said dielectric material layer at sidewalls of said recessed line pattern;
   forming a copper-containing seed layer directly on said metallic barrier layer;
   electroplating a copper-containing layer directly on said copper-containing seed layer, wherein at least one of said copper-containing seed layer and said copper-containing layer comprises a copper-cobalt alloy containing a cobalt concentration from about 1 ppm to about 10 atomic percent; and
   increasing grain size and decreasing resistance within said copper-containing seed layer and said copper-containing layer, wherein said copper-containing seed layer and said copper-containing layer form a bamboo microstructure within said recessed line pattern, and wherein each grain boundary within said bamboo microstructure extends to a bottom surface of said copper-containing layer.

2. The method of claim 1, further comprising annealing said copper-containing seed layer and said copper-containing layer at a temperature from about 20° C. to about 400° C. for a time period from about 1 second to about 1 week, wherein grain size increases during said annealing within said copper-containing layer.

3. The method of claim 1, further comprising planarizing said copper-containing layer, wherein a remaining portion of said copper-containing seed layer and said copper-containing layer constitutes a copper-cobalt alloy line, wherein an average grain size measured at a bottom of said copper-cobalt alloy line exceeds a width of said copper-cobalt alloy line.

4. The method of claim 3, wherein said copper-cobalt alloy line has said bamboo microstructure, wherein each grain boundary extends from said top surface of said copper-cobalt alloy line to a bottom surface of said copper-cobalt alloy line, and is separated from any other grain boundary by a distance greater than said width of said copper-cobalt alloy line.

5. The method of claim 1, wherein said copper-containing seed layer comprises a copper-cobalt alloy containing a cobalt concentration from about 1 ppm to about 10 atomic percent, and wherein said copper-containing seed layer is formed by physical vapor deposition (PVD), chemical vapor deposition (CVD), atomic layer deposition (ALD), electrodeposition, or electroless deposition.

6. A method of forming a metal interconnect structure comprising:
   providing a dielectric material layer containing a recessed line pattern;
   forming a metallic barrier layer directly on said dielectric material layer at sidewalls of said recessed line pattern;
   forming a copper-containing seed layer directly on said metallic barrier layer;
   electroplating a copper-containing layer directly on said copper-containing seed layer;
   forming a copper-cobalt alloy cap layer containing a cobalt concentration from about 1 ppm to about 50 atomic percent directly on said copper-containing layer; and
   increasing grain size and decreasing resistance within said copper-containing seed layer and said copper-containing layer, wherein said copper-containing seed layer and said copper-containing layer form a bamboo microstructure within said recessed line pattern, and wherein each grain boundary within said bamboo microstructure extends to a bottom surface of said copper-containing layer.

7. The method of claim 6, further comprising planarizing said copper-containing layer, wherein a remaining portion of said copper-containing seed layer and said copper-containing layer constitutes a copper-cobalt alloy line, wherein an average grain size measured at a bottom of said copper-cobalt alloy line exceeds a width of said copper-cobalt alloy line.

8. The method of claim 7, wherein said copper-cobalt alloy line has said bamboo microstructure, wherein each grain boundary extends from said top surface of said copper-cobalt alloy line to a bottom surface of said copper-cobalt alloy line, and is separated from any other grain boundary by a distance greater than said width of said copper-cobalt alloy line.

9. A method of forming a metal interconnect structure comprising:
   providing a dielectric material layer containing a recessed line pattern;
   forming a metallic barrier layer directly on said dielectric material layer at sidewalls of said recessed line pattern;
   forming a copper-containing seed layer directly on said metallic barrier layer;
   electroplating a copper-containing layer directly on said copper-containing seed layer, wherein at least one of said copper-containing seed layer and said copper-containing layer comprises a copper-cobalt alloy containing a cobalt concentration from about 1 ppm to about 10 atomic percent; and planarizing said copper-containing layer, wherein a remaining portion of said copper-containing seed layer and said copper-containing layer constitutes a copper-cobalt alloy line, wherein an average grain size measured at a bottom of said copper-cobalt alloy line exceeds a width of said copper-cobalt alloy line.

10. The method of claim 9, further comprising annealing said copper-containing seed layer and said copper-containing layer at a temperature from about 20° C. to about 400° C. for a time period from about 1 second to about 1 week, wherein grain size increases during said annealing within said copper-containing layer.

11. The method of claim 9, wherein said copper-cobalt alloy line has a bamboo microstructure, wherein each grain boundary extends from said top surface of said copper-cobalt alloy line to a bottom surface of said copper-cobalt alloy line, and is separated from any other grain boundary by a distance greater than said width of said copper-cobalt alloy line.

12. The method of claim 9, wherein said copper-containing seed layer comprises a copper-cobalt alloy containing a cobalt concentration from about 1 ppm to about 10 atomic percent, and wherein said copper-containing seed layer is formed by physical vapor deposition (PVD), chemical vapor deposition (CVD), atomic layer deposition (ALD), electrodeposition, or electroless deposition.

\* \* \* \* \*